(12) United States Patent
O'Donnell et al.

(10) Patent No.: US 7,300,537 B2
(45) Date of Patent: Nov. 27, 2007

(54) PRODUCTIVITY ENHANCING THERMAL SPRAYED YTTRIA-CONTAINING COATING FOR PLASMA REACTOR

(75) Inventors: Robert J. O'Donnell, Fremont, CA (US); John E. Daugherty, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 398 days.

(21) Appl. No.: 11/000,894

(22) Filed: Dec. 2, 2004

(65) Prior Publication Data

US 2005/0150866 A1    Jul. 14, 2005

Related U.S. Application Data

(62) Division of application No. 10/180,504, filed on Jun. 27, 2002.

(51) Int. Cl.
*H01L 21/00* (2006.01)
*C23C 16/00* (2006.01)

(52) U.S. Cl. ............ 156/345.51; 156/345.52; 156/345.53; 118/724; 118/725; 118/726; 204/298.01; 216/67

(58) Field of Classification Search ........ 156/915, 156/345.51, 345.52, 345.53; 118/728, 725, 118/724; 428/469; 438/710
See application file for complete search history.

(56) References Cited

U.S. PATENT DOCUMENTS

| | | | |
|---|---|---|---|
| 4,340,462 A | 7/1982 | Koch | |
| 4,948,458 A | 8/1990 | Ogle | |
| 5,200,232 A | 4/1993 | Tappan et al. | |
| 5,262,029 A | 11/1993 | Erskine et al. | |
| 5,788,799 A | 8/1998 | Steger et al. | |
| 5,798,016 A | 8/1998 | Oehrlein et al. | |
| 5,820,723 A | 10/1998 | Benjamin et al. | |
| 5,824,605 A | 10/1998 | Chen et al. | |
| 5,838,529 A | 11/1998 | Shufflebotham et al. | |
| 5,863,376 A | 1/1999 | Wicker et al. | |
| 5,911,852 A | 6/1999 | Katayama et al. | |
| 5,916,454 A | 6/1999 | Richardson et al. | |
| 6,048,798 A | 4/2000 | Gadgil et al. | |
| 6,103,137 A | 8/2000 | Park | |
| 6,123,791 A | 9/2000 | Han et al. | |
| 6,152,070 A | 11/2000 | Fairbairn et al. | |
| 6,227,140 B1 | 5/2001 | Kennedy et al. | |

(Continued)

FOREIGN PATENT DOCUMENTS

DE    9421671 U1    7/1996

(Continued)

OTHER PUBLICATIONS

L. Pawlowski, The Science and Engineering of Thermal Spray Coatings, John Wiley, 1995.

(Continued)

*Primary Examiner*—Ram N. Kackar
(74) *Attorney, Agent, or Firm*—Buchanan Ingersoll & Rooney PC

(57) ABSTRACT

Components of semiconductor processing apparatus comprise thermal sprayed yttria-containing coatings that provide erosion, corrosion and/or corrosion-erosion resistance in plasma atmospheres. The coatings can protect substrates from physical and/or chemical attack.

18 Claims, 5 Drawing Sheets

U.S. PATENT DOCUMENTS

| | | | |
|---|---|---|---|
| 6,312,524 B1 | 11/2001 | Ogawa et al. | |
| 6,352,611 B1 | 3/2002 | Han et al. | |
| 6,367,411 B2 | 4/2002 | Ogawa et al. | |
| 6,388,226 B1 | 5/2002 | Smith et al. | |
| 6,776,873 B1 * | 8/2004 | Sun et al. | 156/345.41 |
| 6,805,952 B2 * | 10/2004 | Chang et al. | 428/334 |
| 2001/0003271 A1 | 6/2001 | Otsuki | |
| 2002/0009560 A1 | 1/2002 | Ozono | |
| 2002/0018921 A1 | 2/2002 | Yamada et al. | |
| 2002/0086118 A1 | 7/2002 | Chang et al. | |
| 2002/0177001 A1 | 11/2002 | Harada et al. | |

FOREIGN PATENT DOCUMENTS

| | | | |
|---|---|---|---|
| EP | 1156130 A1 | * | 11/2001 |
| JP | 2001164354 A | * | 6/2001 |

OTHER PUBLICATIONS

Notification of Transmittal of the International Search Report or the Declaration dated Feb. 19, 2004 for PCT/US03/18502.

Written Opinion for PCT/US03/18502 dated Mar. 1, 2004.

\* cited by examiner

PRODUCTIVITY ENHANCING THERMAL SPRAYED YTTRIA-CONTAINING COATING FOR PLASMA REACTOR

This application is a divisional application of U.S. application Ser. No. 10/180,504 entitled PRODUCTIVITY ENHANCING THERMAL SPRAYED YTTRIA-CONTAINING COATING FOR PLASMA REACTOR, filed on Jun. 27, 2002, the entire content of which is hereby incorporated by reference.

BACKGROUND OF THE INVENTION

1. Field of the Invention

The invention relates to components for semiconductor material processing apparatuses. The components are formed of materials that can reduce contamination of semiconductor materials during semiconductor material processing. The invention also relates to methods of making the components.

2. Description of the Related Art

In the field of semiconductor material processing, vacuum processing chambers are used for etching and chemical vapor deposition (CVD) of materials on substrates. Process gases are flowed into the processing chamber while a radio frequency (RF) field is applied to the process gases to generate a plasma of the process gases. The plasma performs the desired etching or deposition of selected materials on wafers. Examples of parallel plate, transformer coupled plasma (TCP™), which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723.

During processing of semiconductor substrates, the substrates are typically supported within the vacuum chamber by substrate holders, as disclosed, for example, in U.S. Pat. Nos. 5,262,029 and 5,838,529. Process gas can be supplied to the chamber by various gas supply systems.

In addition to the plasma chamber equipment, other equipment used in processing semiconductor substrates includes transport mechanisms, liners, lift mechanisms, load locks, door mechanisms, robotic arms, fasteners, and the like.

Plasmas are used to remove materials by etching or to deposit materials on substrates. The plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. As a result, the surface materials are removed by physical and/or chemical attack, including erosion, corrosion and/or corrosion-erosion. This attack causes problems including short part lifetimes, increased consumable costs, particulate contamination, on-wafer transition metal contamination and process drift.

In light of these problems, plasma processing chambers have been designed to include parts, such as, disks, rings, and cylinders, that confine the plasma over the wafer being processed. However, these parts are continuously attacked by the plasma and, consequently, ultimately erode or accumulate polymer buildup. Eventually, these parts suffer such wear that they are no longer usable. Parts with relatively short lifetimes are commonly referred to as "consumables." If the consumable part's lifetime is short, then the cost of ownership is high. Erosion of consumables and other parts generates contamination in plasma processing chambers.

Because of the erosive and corrosive nature of the plasma environment in such reactors, and the need to minimize particle and/or metal contamination, it is desirable for components of such equipment, including consumables and other parts, to have suitably high erosion and corrosion resistance. Parts have been formed from materials that provide resistance to corrosion and erosion in plasma environments. See, for example, U.S. Pat. Nos. 5,798,016; 5,911,852; 6,123,791 and 6,352,611.

SUMMARY OF THE INVENTION

The invention provides components of semiconductor processing apparatus made of materials that can provide improved wear resistance to physical and/or chemical attack in plasma processing environments. The components can provide low levels of contamination with respect to metals and particulates.

An exemplary embodiment of a component of a semiconductor processing apparatus according to the invention comprises a substrate including a surface and a thermal-sprayed yttrium oxide (yttria)-containing coating on the surface. The coating comprises an outermost surface of the component.

An exemplary embodiment of a process of making a component of a semiconductor processing apparatus according to the invention comprises forming a yttria-containing coating on a surface of the component by thermal spraying. The coating comprises an outermost surface of the component.

In a preferred embodiment, the thermal sprayed yttria-containing coatings can be formed directly on substrate surfaces.

In addition, the invention provides semiconductor processing apparatuses that include at least one of above-described yttria-containing components.

BRIEF DESCRIPTION OF THE DRAWINGS

The invention will be readily understood by the following detailed description in conjunction with the accompanying drawings.

DETAILED DESCRIPTION OF THE PREFERRED EMBODIMENTS

Figure 1:
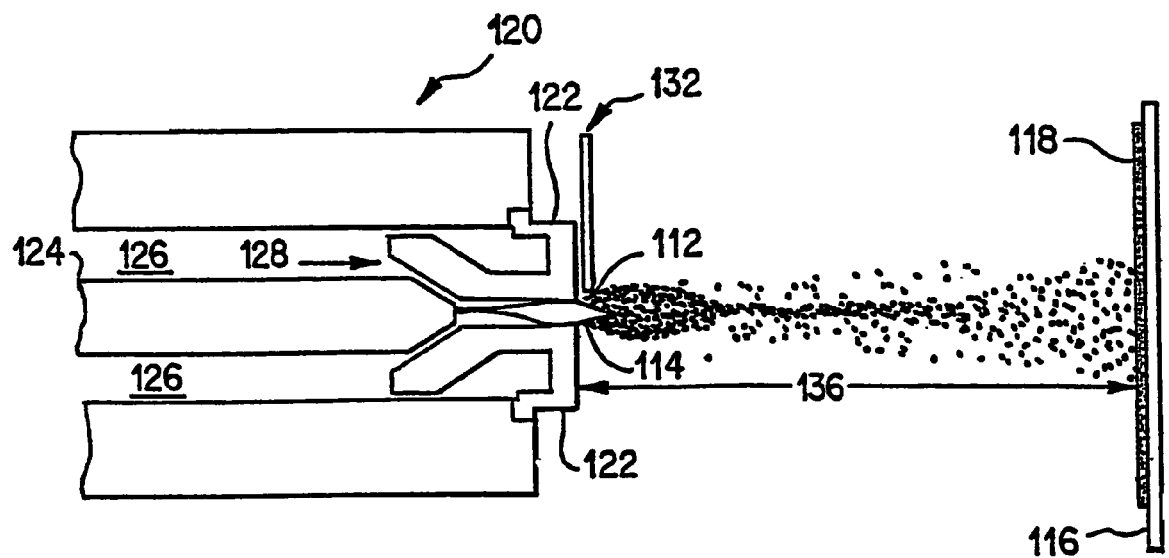
FIG. 1 illustrates a conventional plasma spray process.

The invention provides components suitable for use in semiconductor material processing apparatuses. The components can provide wear resistance with respect to physical and chemical attack by plasmas generated in semiconductor material processing apparatuses during processing. As used herein, the term "wear resistant" includes, but is not limited to, resistance to erosion, corrosion and/or corrosion-erosion.

The components comprise a yttrium oxide (yttria)-containing coating. The yttria-containing coating provides an outer surface resistant to chemical and/or physical attack by plasmas in apparatuses for processing semiconductors.

In addition, the invention provides methods of making components that comprise the yttria-containing coatings to enhance the wear resistance of the components in plasma environments.

Those skilled in the art will appreciate that the wear resistant materials can be applied to different processing apparatuses useful for processing different semiconductor materials. In addition, the wear resistant materials can be applied to different components in the processing apparatuses. Such exemplary components include, but are not limited to, parts of a plasma and/or vacuum chamber, such as, for example, chamber walls, substrate supports, gas distribution systems including showerheads, baffles, rings, nozzles, etc., fasteners, heating elements, plasma screens, liners, transport module components, such as robotic arms, fasteners, inner and outer chamber walls, and the like.

The yttria-containing materials preferably consist essentially of yttria. In order to try to minimize the contamination of semiconductor materials processed in apparatuses incorporating one or more components comprising yttria-containing materials, it is desirable that the yttria-containing materials be as pure as possible, e.g., include minimal amounts of potentially contaminating elements, such as transition metals, alkali metals and the like. For example, the yttria-containing coatings can be sufficiently pure to avoid on-wafer contamination of $10^{10}$ atoms/cm$^2$ or higher, preferably $10^5$ atoms/cm$^2$ or higher. Preferably, the yttria-containing materials have a high purity of at least about 99%, and more preferably from about 99.95% to about 100%.

The yttria-containing coatings can provide a high bond strength to the underlying substrate. Preferably, the yttria-containing coatings have a tensile bond strength of from about 2000 psi to about 7000 psi.

The yttria-containing coatings can provide low porosity levels, which is advantageous to minimize contact of aggressive atmospheres with the underlying substrate, and thus subsequent physical and/or chemical attack by corrosion, erosion and/or corrosion-erosion of the substrate by the aggressive atmosphere. Preferably, the yttria-containing coatings have a porosity of less than 15% by volume, more preferably less than about 3% by volume, and most preferably less than about 1% by volume.

In addition, the yttria-containing coatings can provide a high hardness to resist erosion. Preferably, the ceramic materials have a hardness (Vickers HV30) of from about 200 to about 800.

The yttria-containing coatings have a crystal structure that is preferably from about 10% to about 100% cubic, and more preferably more than about 95% cubic.

The yttria-containing coatings can have a color ranging from pure white to dark grey/black. The coatings preferably are white.

The yttria-containing coatings can provide desirable wear resistance properties for use in semiconductor processing apparatus, such as, e.g., plasma etch chambers. In particular, the yttria-containing coatings provide surfaces that can reduce ion induced erosion and associated levels of particulate contamination in plasma reactor chambers. The yttria-containing coatings can protect underlying substrates against both physical attack and chemical attack by plasmas.

The wear resistant coatings can be used in various different plasma atmospheres for etching, deposition, as well as other applications. Typical etch chemistries include, for example, chlorine containing gases including, but not limited to, $Cl_2$, HCl and $BCl_3$; bromine containing gases including, but not limited to, $Br_2$ and HBr; oxygen containing gases including, but not limited to, $O_2$, $H_2O$ and $SO_2$; fluorine containing gases including, but not limited to, $CF_4$, $CH_2F_2$, $NF_3$, $CH_3F$, $C_2F_6$, $CHF_3$ and $SF_6$; and inert and other gases including, but not limited to He, Ar and $N_2$. These and other gases may be used in any suitable combination, depending on the desired plasma. Typical maximum flow rates for the etch chemistries are: $Cl_2$, 200 sccm; HCl, 100 sccm; $BCl_3$, 200 sccm; HBr, 200 sccm; $O_2$, 20 sccm; $H_2O$, 100 sccm; $SO_2$, 200 sccm; $CF_4$, 200 sccm; $CH_2F_2$, 100 sccm; $CH_3F$, 100 sccm; $C_2F_6$, 100 sccm; $CHF_3$, 100 sccm; $SF_6$, 200 sccm; He, 200 sccm; Ar, 200 sccm; and $N_2$, 200 sccm. Suitable flow rates of the various process gases can be selected based on factors including, but not limited to, the type of plasma reactor, power settings, chamber pressure, plasma dissociation rates, etch chemistries, materials etched, and the particular step of the etch process in which the process gas is used.

Exemplary plasma etch reactor etching operating conditions for a high density plasma reactor are as follows: substrate temperature of from about 0° C. to about 70° C.; chamber pressure of from about 0 mTorr to about 100 mTorr; gas flow rate of from about 10 sccm to about 1000 sccm; and plasma generating power of from more than 0 Watts to about 1500 Watts, and typically from about 200 Watts to about 800 Watts. The power that is most suitable is dependent on the type of wafer that is etched in the plasma reactor.

Components including a yttria-containing coating can be used in etch chambers of semiconductor processing equipment for etching silicon-containing and metal-containing materials in semiconductor plasma etching processes. For example, silicon-containing materials that can be etched in such etch chambers include, but are not limited to, single-crystal silicon, polycrystalline silicon, amorphous silicon, silicon nitride, silicon oxynitride, silicides, silicon dioxide, low-k materials, and high-k materials. The silicon-containing materials can doped or un-doped and/or annealed or un-annealed.

Conductive or semiconductive metal-containing materials that can be etched include, but are not limited to, aluminum, aluminum alloys, tungsten, tungsten alloys, titanium, titanium alloys, tantalum, tantalum alloys, platinum, platinum alloys, ruthenium, ruthenium alloys, chrome, chrome alloys, iron, iron alloys, nickel, nickel alloys, cobalt, cobalt alloys, molybdenum, molybdenum alloys, silicides of titanium, tungsten, chrome, cobalt and/or molybdenum, ferroelectric materials, such as platinum silicide and ruthenium oxide, and GMR materials, such as tantalum nitride, chrome silicide and NiFeCo alloys.

The yttria-containing coatings are preferably formed on substrates by a thermal spraying technique. In thermal spraying techniques, ceramic powder is melted and incorporated in a gas stream directed at the component being spray coated. An advantage of thermal spraying techniques is that the component is coated only on the sides facing the thermal spray gun, and masking can be used to protect other areas. Conventional thermal spraying techniques, including plasma spraying, are described in *The Science and Engineering of Thermal Spray Coating* by Pawlowski (John Wiley, 1995). This description is hereby incorporated by reference in its entirety. The thermal sprayed yttria-containing coatings can be formed on any substrates that are suitably shaped to enable them to be coated.

A particularly preferred thermal spraying technique is plasma spraying. Plasma spraying can coat even intricate interior surfaces of chambers and other chamber components. FIG. 1 illustrates a typical plasma spraying process. The coating material, usually in the form of a powder 112, is injected into a high temperature plasma flame 114 usually via an external powder port 132. The powder is rapidly heated and accelerated to a high velocity. The hot material impacts on the substrate surface 116 and rapidly cools to form a coating 118.

The plasma spray gun 120 comprises an anode 122 and a cathode 124, both of which are water cooled. Plasma gas 126 (e.g., argon, nitrogen, hydrogen, helium) flows around the cathode in the direction generally indicated by arrow 128 and through a constricting nozzle of the anode. The plasma is initiated by a high voltage discharge, which causes localized ionization and a conductive path for a DC arc to form between the cathode 124 and the anode 122. Resistance heating from the arc causes the gas to form a plasma. The plasma exits the anode nozzle portion as a free or neutral plasma flame (i.e., plasma that does not carry electric current). When the plasma is stabilized and ready for spraying, the electric arc extends down the nozzle. The powder 112 is so rapidly heated and accelerated that the spray distance 136 between the nozzle tip and the substrate surface can be on the order of 125 to 150 mm. Plasma sprayed coatings are produced by molten or heat-softened particles impacting on the substrate surface 116.

The thermal sprayed yttria-containing coatings can be formed directly on preferred substrate materials with or without having previously treated the substrate surface to promote adhesion of the coatings, and/or with or without having previously formed intermediate coatings on the substrate to enhance adhesion of the coatings on the substrates. For example, the yttria-containing coatings can be applied directly to anodized aluminum, alumina or quartz substrates without treating the substrate surface or utilizing intermediate coatings. In a preferred embodiment, the yttria-containing coatings provide suitable adherence to the substrates without treating the substrate and/or forming intermediate layers. Accordingly, because the yttria-containing coatings can be applied to substrates without performing such additional prior process steps, the increased cost, complexity and/or completion time of the coating process contributed to such additional process steps can be avoided.

Prior to forming the yttria-containing coatings on substrates, the substrate surface to be coated is preferably cleaned to remove undesirable surface substances, such as oxides or grease. In some embodiments, surface treating techniques, such as cleaning and particle blasting, can be used to provide a more chemically and physically active surface for bonding of the coating. While less preferred, the surface of substrate can be roughened by any suitable method, such as grit blasting, prior to coating. Roughening of the substrate increases the surface area available for bonding of the coating, which increases the coating bond strength. The rough substrate surface profile can also promote mechanical keying or interlocking of the coating with the substrate.

For aluminum reactor components, it is preferable to anodize the surface of the component that is to be coated prior to coating, but to not roughen the anodized surface. The anodized layer provides an additional barrier, i.e., in addition to the protection provided by the coating, against corrosive attack of the underlying aluminum material. The anodized aluminum layer formed on aluminum substrates, such as 6061-T6 aluminum, can have any suitable thickness. For example, the anodized aluminum layer thickness can typically be from about 2 mil to about 10 mil. The surface of the anodized aluminum layer can have any suitable finish. For example, the surface finish can have a surface roughness of about 20 to about 100 micro-inch. The anodized layer can be sealed by any suitable technique, such as by using boiling deionized water.

The thermal sprayed yttria-containing coatings can have desired surface roughness characteristics effective to promote the adhesion of contaminants to the coatings. The contaminants can include polymer deposits, which result from the use of polymer forming species (usually fluorocarbons) during plasma etching processes, such as metal etching processes. As described in co-pending U.S. patent application Ser. No. 09/749,917, which is incorporated herein by reference in its entirety, such polymer deposits can flake or peel off of chamber surfaces during etching processes and contaminate substrates within the chamber. The thermal cycling that occurs during repeated plasma processing cycles exacerbates this problem.

The thermal sprayed yttria-containing coatings can have surface roughness values (Ra) suitable for enhancing adhesion of polymer byproducts produced during processing of substrates in the plasma reactor. For example, the arithmetic mean surface roughness (Ra) of the thermal sprayed yttria-containing coatings can range from about 5 to about 400 micro-inches, and preferably from about 120 to about 250 micro-inches. Surface roughness values in this range promote the adhesion of polymer deposited on interior surfaces of the reaction chamber during a plasma etch process, such as a metal etch. Accordingly, the thermal sprayed yttria-containing coatings can improve the adhesion of such polymer deposits on components, and thereby reduce the occurrence of contamination by the polymer deposits.

However, in some preferred embodiments, the thermal sprayed yttria-containing coatings can be smooth. For example, in silicon etching processes, significant deposits tend to form on chamber surfaces. For such processes, it is not as desirable for the thermal sprayed yttria-containing coatings to have rough surfaces to promote adhesion of the deposits on the coatings. In addition, smoother surfaces are relatively easy to clean.

Figure 2:
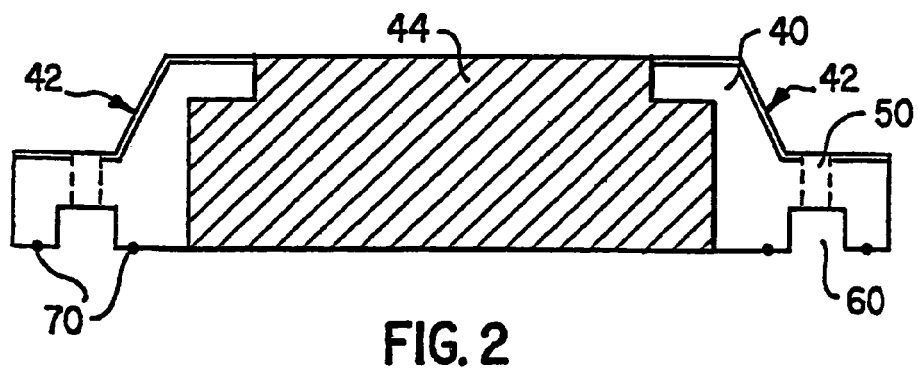
FIG. 2 shows a cross-sectional view of a gas ring for a plasma etching apparatus according to an exemplary embodiment of the invention.

In some preferred embodiments, the components including a yttria-containing coating are used in a high-density plasma reactor. An exemplary reactor of this type is the TCP 9400™ plasma etch reactor available from Lam Research Corporation of Fremont, Calif. In the TCP 9400™ reactor, processing gases (such as $Cl_2$, HBr, $CF_4$, $CH_2F_2$, $O_2$, $N_2$, Ar, $SF_6$ and $NF_3$) are conducted into a gas ring located at the bottom of the etch chamber and are then guided through gas holes into the reactor chamber. FIG. 2 shows a gas ring for a TCP 9400™ etch reactor. As shown in FIG. 2, the main body of the gas ring 40 surrounds a substrate support 44. The bottom surface of the gas ring 40 contains a ring-shaped gas-guiding trench 60. The aforementioned gas holes 50 extend into the gas-guiding trench 60.

The gas ring 40 is typically composed of aluminum. Upper surfaces of the gas ring are directly exposed to the plasma and thus subject to erosion, corrosion and corrosion-erosion. To protect these surfaces, the gas ring is typically covered with an aluminum oxide layer. For example, in silicon etch applications, fluorine-containing atmospheres can produce aluminum fluoride "brown dust" by attacking anodized aluminum. In metal etch applications, boron trichloride ($BCl_3$) can etch away the anodized aluminum surface, resulting in corrosion of components. In addition, anodized aluminum is relatively brittle and can crack during repeated thermal cycling of the reactor during use. Cracks that form in the anodized layer can allow the corrosive process gases to attack the underlying aluminum layer, reducing part life and contributing to metallic and particle contamination of processed substrates, such as wafers, flat panel display substrates and the like.

In exemplary embodiments, the exposed surfaces of the gas ring can be covered with a coating 42 of a yttria-containing material. The coatings can be formed on a bare (with or without a native oxide surface film) aluminum substrate or on an aluminum oxide layer (e.g., aluminum having an anodized surface). When coating the gas ring, the coating can be allowed to partially penetrate into the gas holes to coat and protect the inside walls thereof, but without obstructing the openings. Alternatively, the gas holes can be uncoated, e.g., the gas holes can be plugged or masked during the coating process.

Other components of the TCP 9400™ etch reactor that can be exposed to the plasma during processing can also be coated with a yttria-containing coating. These components include, for example, chamber walls, chamber liners, chucking devices and the dielectric window opposite the substrate. Providing a yttria-containing coating on the upper surface of a chucking device, such as an electrostatic chuck, provides additional protection to the chuck during cleaning cycles in which a wafer is not present and the upper surface of the chuck is thus directly exposed to the plasma.

Figure 3:
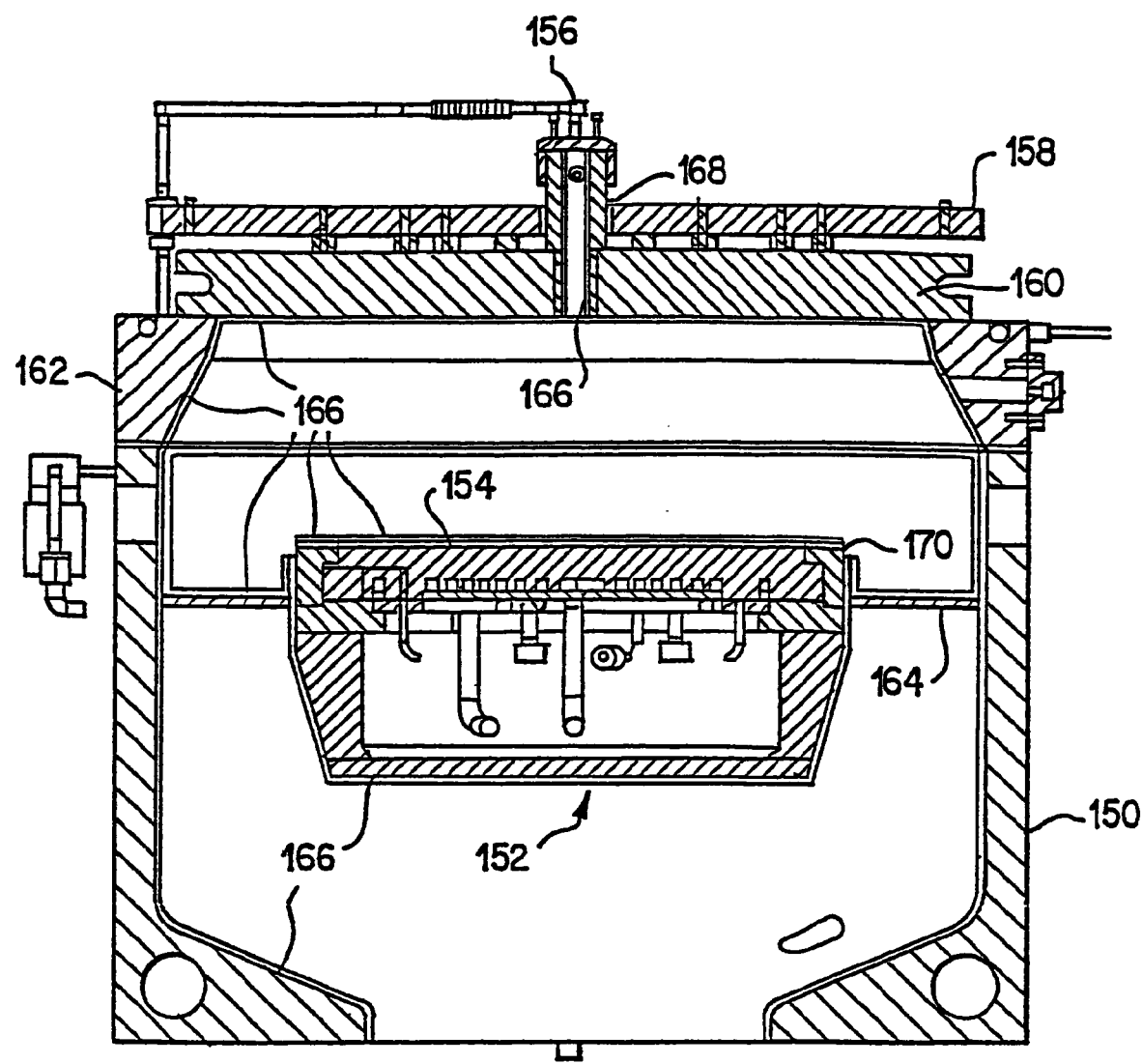
FIG. 3 shows an etch chamber containing exemplary embodiments of components according to the invention.

Another exemplary polysilicon etch reactor that can include the yttria-containing coatings according to the invention is the Versys™ Polysilicon Etcher or 2300™ etcher also available from Lam Research Corporation of Fremont, Calif., as shown in FIG. 3. The reactor comprises a reactor chamber 150 that includes a substrate support 152 including an electrostatic chuck 154, which provides a clamping force to a substrate (not shown) mounted thereon. A focus ring 170 is mounted on the substrate support 152 around the electrostatic chuck 154. The substrate support 152 can also be used to apply an RF bias to the substrate. The substrate can also be back-cooled using a heat transfer gas such as helium. In the 2300™ etcher, processing gases (e.g., one or more of $Cl_2$, HBr, $CF_4$, $CH_2F_2$, $O_2$, $N_2$, Ar, $SF_6$ or $NF_3$) are introduced into the chamber 150 via a gas injector 168 located on the top of the chamber 150 and connected to a gas feed 156. The gas injector 168 is typically made of quartz or a ceramic material such as alumina. As shown, an inductive coil 158 can be powered by a suitable RF source (not shown) to provide a high density (e.g., $10^{11}$-$10^{12}$ ions/cm$^3$) plasma. The inductive coil 158 couples RF energy through dielectric window 160 into the interior of chamber 150. The dielectric window 160 is typically made of quartz or alumina. The dielectric window 160 is shown mounted on an annular member 162. The annular member 162 spaces dielectric window 160 from the top of chamber 150 and is referred to as a "gas distribution plate". A chamber liner 164 surrounds the substrate support 152. The chamber 150 can also include suitable vacuum pumping apparatus (not shown) for maintaining the interior of the chamber at a desired pressure.

In FIG. 3, selected internal surfaces of reactor components, such as the annular member 162, dielectric window 160, substrate support 152, chamber liner 164, gas injector 168, focus ring 170 and the electrostatic chuck 154, are shown coated with a yttria-containing coating 166 according to the invention. As shown in FIG. 3, selected interior surfaces of the chamber 150 and substrate support 152 below the chamber liner 164 can also be provided with a yttria-containing coating 166. Any or all of these surfaces, as well as any other internal reactor surface, can be provided with a yttria-containing coating.

The components can be used in a high-density oxide etch process. An exemplary oxide etch reactor is the TCP 9100™ plasma etch reactor available from Lam Research Corporation of Fremont, Calif. In the TCP 9100™ reactor, the gas distribution plate is a circular plate situated directly below the TCP™ window, which is also the vacuum sealing surface at the top of the reactor in a plane above and parallel to a semiconductor wafer. The gas distribution plate is sealed to a gas distribution ring located at the periphery of the gas distribution plate. The gas distribution ring feeds gas from a gas source into the volume defined by the gas distribution plate, an inside surface of a window underlying an antenna in the form of a flat spiral coil supplying RF energy into the reactor, and the gas distribution ring. The gas distribution plate contains holes of a specified diameter, which extend through the plate. The spatial distribution of the holes through the gas distribution plate can be varied to optimize etch uniformity of the layers to be etched, e.g., a photoresist layer, a silicon dioxide layer and an underlayer material on the wafer. The cross-sectional shape of the gas distribution plate can be varied to manipulate the distribution of RF power into the plasma in the reactor. The gas distribution plate is a dielectric material to enable coupling of this RF power through the gas distribution plate into the reactor. Further, it is desirable for the material of the gas distribution plate to be highly resistant to chemical sputter-etching in environments, such as oxygen, halogen or hydro-fluorocarbon gas plasma, to avoid breakdown and the resultant particle generation associated therewith.

Figure 4:
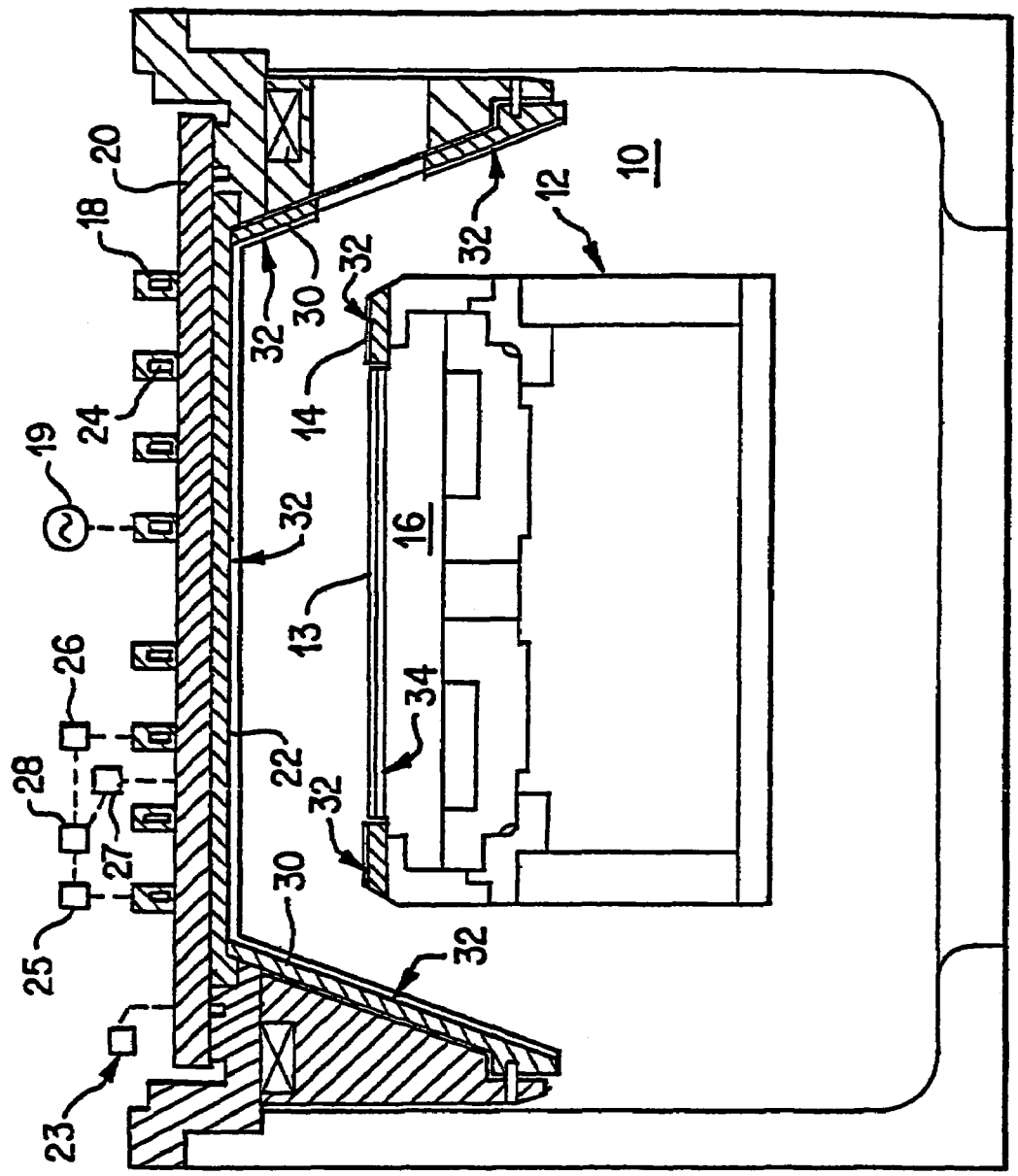
FIG. 4 shows another etch chamber containing exemplary embodiments of components according to the invention.

FIG. 4 illustrates a plasma reactor of the aforementioned type. The reactor comprises a reactor chamber 10. A substrate holder 12 includes an electrostatic chuck 34, which provides a clamping force and an RF bias to a substrate 13. The substrate can be back-cooled using a heat transfer gas such as helium. A focus ring 14 confines plasma in a region above the substrate. A source of energy for maintaining a high density (e.g., $10^{10}$-$10^{12}$ ions/cm$^3$) plasma in the chamber, such as an antenna 18 powered by a suitable RF source to provide a high density plasma, is disposed at the top of the reactor chamber 10. The reactor chamber includes a vacuum pumping apparatus for maintaining the interior of the chamber at a desired pressure (e.g., below 50 mTorr, typically 1-20 mTorr).

A substantially planar dielectric window 20 is provided between the antenna 18 and the interior of the processing chamber 10 and forms the vacuum wall at the top of the processing chamber 10. A gas distribution plate 22 is provided beneath window 20 and includes openings for delivering process gas from the gas supply 23 to the chamber 10. A liner 30, such as a conical or cylindrical liner, extends from the gas distribution plate 22 and surrounds the substrate holder 12. The antenna 18 can be provided with a channel 24 through which a temperature control fluid is flowed via inlet and outlet conduits 25, 26. However, the antenna 18 and/or window 20 need not be cooled, or could be cooled by other suitable technique, such as by blowing gas over the antenna and window, passing a cooling fluid through or in heat transfer contact with the window and/or gas distribution plate, etc.

In operation, a substrate, such as a semiconductor wafer, is positioned on the substrate holder 12 and held in place by an electrostatic chuck 34. Other clamping means, however, such as a mechanical clamping mechanism can also be used.

Additionally, helium back-cooling can be employed to improve heat transfer between the substrate and chuck. Process gas is then supplied to the vacuum processing chamber 10 by passing the process gas through a gap between the window 20 and the gas distribution plate 22. Suitable gas distribution plate arrangements (i.e., showerhead) arrangements are disclosed in commonly owned U.S. Pat. Nos. 5,824,605; 6,048,798; and 5,863,376, each of which is incorporated herein by reference in its entirety. A high density plasma is ignited in the space between the substrate and the window by supplying suitable RF power to the antenna 18.

In FIG. 4, the exposed internal surfaces of reactor components, such as the gas distribution plate 22, the chamber liner 30, the electrostatic chuck 34, and the focus ring 14 are coated with a yttria-containing coating 32. However, only selected ones of these surfaces, and/or other surfaces, can be coated with a yttria-containing coating.

Those skilled in the art will appreciate that the high density polysilicon and dielectric etch chambers described above are only exemplary embodiments of plasma etch reactors that can incorporate the components. Components including a yttria-containing coating can be used in any etch reactor (e.g., a metal etch reactor) or other type of semiconductor processing apparatus where the reduction of plasma induced erosion, corrosion and/or corrosion-erosion and associated contamination is desired.

Other exemplary components that can be provided with a yttria-containing coating include, but are not limited to, chamber walls, substrate holders, fasteners, etc. These components are typically made from metal (e.g., aluminum) or ceramic (e.g., alumina), and are typically exposed to plasma and often show signs of erosion, corrosion and/or corrosion-erosion. Other parts that can be coated with a yttria-containing coating need not be directly exposed to plasma, but may instead be exposed to corrosive gases, such as gases emitted from processed wafers or the like. Therefore, other equipment used in processing semiconductor substrates can also be provided with yttria-containing coatings. Such equipment can include transport mechanisms, gas supply systems, liners, lift mechanisms, load locks, door mechanisms, robotic arms, fasteners, and the like.

In a preferred embodiment, a yttria-containing coating is provided on a metallic component. As described above, anodized or non-anodized aluminum-based materials, including aluminum and aluminum alloys, e.g., 6061-T6 aluminum, can be coated with yttria-containing coatings. Other exemplary metallic materials that can be coated include, but are not limited to, stainless steels and refractory metals, e.g., 304 and 316 stainless steels. Because the yttria-containing coatings form a wear resistant coating over the component, the underlying component is protected from direct exposure to the plasma. Accordingly, the metallic component can be protected against erosion, corrosion and/or corrosion-erosion attack by the plasma. As a result, metallic materials, such as aluminum alloys, can be used without regard to alloying additions, grain structure or surface conditions.

In addition, various ceramic or polymeric materials can be coated with a yttria-containing coating. In particular, the reactor components can be made from ceramic materials, including, but not limited to, alumina ($Al_2O_3$), silicon carbide (SiC), silicon nitride ($Si_3N_4$), boron carbide ($B_4C$) and/or boron nitride (BN). Polymeric materials that can be coated are preferably those that can withstand elevated temperature conditions present in plasma reactors.

Figure 5:
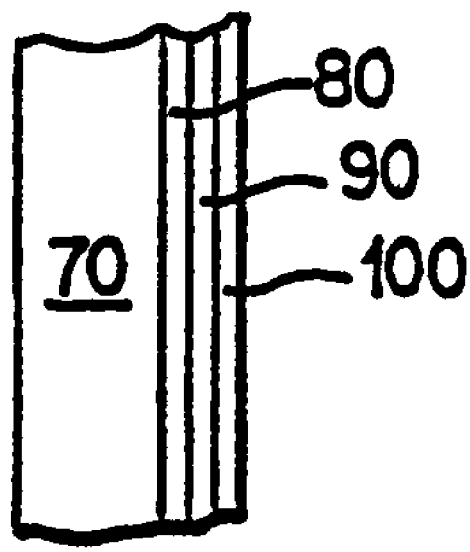
FIG. 5 shows an exemplary embodiment of a protective coating according to the invention.

If desired, one or more intermediate layers of material can be provided between the surface of the component that is coated and the yttria-containing coating. FIG. 5 shows a coated component according to an exemplary preferred embodiment. A first intermediate coating 80 is optionally coated on a substrate 70 by a conventional technique. The optional first intermediate coating 80 is sufficiently thick to adhere to the substrate and to further allow it to be processed prior to forming an optional second intermediate coating 90, or the yttria-containing coating 100. The first intermediate coating 80 and the second intermediate coating 90 can have any suitable thickness that provides these desired properties. These coatings can have a thickness of at least about 0.001 inch, preferably from about 0.001 to about 0.25 inch, more preferably from about 0.001 to about 0.15 inch, and most preferably from about 0.001 inch to about 0.05 inch.

After depositing the optional first intermediate coating 80 onto the reactor component 70, the first intermediate coating can be treated, such as by roughening using any suitable technique, and then coated with the optional second intermediate coating 90, or with the yttria-containing coating 100. A roughened first intermediate coating 80 provides a particularly good bond to subsequently applied coatings. Desirably, the second intermediate coating 90 imparts a high mechanical compression strength to the first intermediate coating 80 and reduces formation of fissures in the second intermediate coating 90.

The second intermediate coating 90 is sufficiently thick to adhere to the first intermediate coating 80 and to allow it to be processed prior to forming any additional intermediate coatings, or the outer yttria-containing coating 100. The second intermediate coating 90 also can be treated, such as by roughening. The second intermediate coating 90 can have any suitable thickness that provides these desired properties, such as a thickness of at least about 0.001 inch, preferably from about 0.001 to about 0.25 inch, more preferably from about 0.001 and about 0.15 inch, and most preferably from about 0.001 inch to about 0.05 inch.

The first and second intermediate coatings can be made of any metallic, ceramic and polymer materials that are suitable for use in semiconductor plasma processing chambers. Particularly desirable metals that can be used include, but are not limited to, refractory metals, which can withstand high processing temperatures. Preferred ceramics include, but are not limited to, $Al_2O_3$, SiC, $Si_3N_4$, $B_4C$, AlN, $TiO_2$ and mixtures thereof. Preferred polymers include, but are not limited to, fluoropolymers, such as polytetrafluoroethylene and polyimides.

The intermediate coatings can be applied by any suitable deposition technique such as plating (e.g., electroless plating or electroplating), sputtering, immersion coating, chemical vapor deposition, physical vapor deposition, electrophoretic deposition, hot isostatic pressing, cold isostatic pressing, compression molding, casting, compacting and sintering, and thermal spraying (e.g., plasma spraying).

The optional first intermediate coating 80 and second intermediate coating 90 can have the same or different compositions from each other, depending on their desired properties. If desired, additional intermediate coatings such as a third, fourth or fifth intermediate coating of the same or different materials can also be provided between the yttria-containing coating and the substrate.

Figure 6:
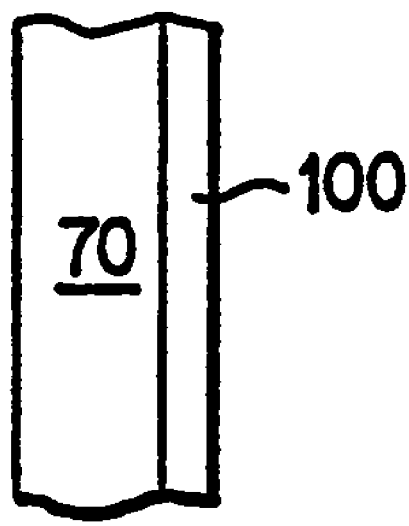
FIG. 6 shows another exemplary embodiment of a protective coating according to the invention.

FIG. 6 shows another exemplary embodiment of the yttria-containing coatings. In this embodiment, the yttria-containing coating 100 is deposited directly onto a substrate (i.e., without the formation any intermediate layers), which is an outer surface of the component 70. In this and in other embodiments, the coating 100 can have any suitable thickness. The yttria-containing coating 100 has at least a minimum thickness that provides sufficient coverage of the underlying surface to provide wear resistance and protect the underlying surface against physical and chemical attack, when the yttria-containing coating is exposed to plasma atmospheres. Particularly, the coating 100 can have a thickness in the range of about 0.001 inch to about 1 inch, preferably from about 0.001 inches to about 0.5 inch, more preferably from about 0.001 inch to about 0.1 inch, and most preferably from about 0.01 inch to about 0.1 inch. This thickness can also be used in other embodiments. The thickness of the yttria-containing coating can be selected to be compatible with the plasma environment to be encountered in the reactor (e.g., etching, CVD, etc.).

The yttria-containing coatings can be provided on all or part of the reactor chamber and components. In a preferred embodiment, the coatings are provided on the regions of the reactor chamber that are exposed to the plasma environment, such as those parts in direct contact with the plasma, or parts located behind chamber components, such as liners. Additionally, it is preferred that the yttria-containing coating be provided at regions of the reactor chamber that are subjected to relatively high bias voltages (i.e. relatively high sputter ion energies).

By applying a yttria-containing coating, advantages are realized. Namely, the yttria-containing coatings can be used for all plasma chemistries. The coatings are advantageous for use in fluorine-containing and $BCl_3$ containing-atmospheres, which are highly erosive to anodized aluminum. By using the yttria-containing coatings in such atmospheres, significantly reduced erosion rates are achievable in plasma reactors.

Tests were conducted to demonstrate the effectiveness of the yttria-containing coatings in providing an erosion resistant surface in a plasma environment. Three anodized 6061-T6 aluminum coupons and three coupons each made by forming a thermal sprayed yttria-containing coating on a surface of an anodized 6061-T6 aluminum coupon were attached to a chamber wall in a plasma reactor chamber. The yttria-containing coatings had a composition of about 99.95 wt. % yttria. The coupons each had a 1 inch diameter and a thickness of 0.375 inch. The coupons were attached to the chamber wall. A plasma was generated from a process gas comprising $Cl_2$ and $BCl_3$ at equal flow rates, and the interior of the chamber was set to a pressure of 6 mTorr. Bare silicon wafers were etched in the reactor chamber. The coupons were tested for a total of about 90 RF-hours.

Following the testing, yellow dust permeated the reactor chamber. The dust was analyzed using EDS analysis and found to contain primarily boron, oxygen and chlorine.

The coupons were evaluated to determine coupon mass loss using an analytical balance, and also were evaluated to determine estimated erosion rates. The anodized 6061-T6 aluminum coupons without a yttria-containing coating were determined to have lost from about 15 to 20 mg. Accordingly, the process gas was highly erosive with respect to these un-coated coupons.

In contrast, the three coupons having a yttria-containing coating each gained weight due to the accumulation of dust on the coatings. The weight gain of the three coated coupons ranged from about 0.8 mg to about 1.2 mg. The weight gain rate of the three coated coupons ranged from about 0.009 mg/RF-hr to about 0.013 mg/RF-hr.

Regarding the estimated erosion rate, the anodized 6061-T6 aluminum coupons without a yttria-containing coating significantly eroded, as evidenced by the significant weight loss. These coupons were determined to have an estimated average erosion rate of from about 20 to 27 Å/RF-min. In contrast, the three coupons having a yttria-containing coating were not eroded.

In addition, because aluminum components are protected from attack by fluorine, the yttria-containing coatings can minimize or even prevent the formation of aluminum fluoride when coated components are used in a fluorine-containing process gas atmosphere in a plasma reactor.

Tests were also performed to demonstrate the reduction of contamination of wafers during etching in a plasma reactor by providing components in the plasma reactor chamber that include a thermal sprayed yttria-containing coating, which consists essentially of yttria. Tests were performed on a 9400DFM plasma reactor with a chamber liner fully encapsulated with a yttria-containing coating, a ground ring coated with a yttria-containing coating, ground ring screw caps coated with a yttria-containing coating, and a quartz window in the reactor chamber.

The reactor chamber was prepared by a procedure including a wet clean with 6% $H_2O$+isopropyl alcohol wipe down, and a wet clean recovery procedure using six oxide wafers and the following process parameters: 15 mT chamber pressure/800 Watts top coil power/0 W bottom electrode power/100sccm $SF_6$/20 sccm $Cl_2$/50 sccm $O_2$/8 Torr He back cool/300 sec etch time. Conditioning of the reactor chamber was performed using ten bare silicon wafers with the following process parameters: break through etch: 4 mTorr chamber pressure/600 Watts top coil power/65 Watts bottom electrode power/100 sccm HBr/10 sec etch time; main etch: 6 mTorr chamber pressure/350 Watts top coil power/20 Watts bottom electrode power/180 sccm HBr/65 sec etch time; and over etch: 80 mT chamber pressure/350 Watts top coil power/75 Watts bottom electrode power/150 sccm HBr/150 sccm He/5 sccm $O_2$/90 sec etch time. High pressure waferless autocleaning was used after every wafer.

Contamination of the wafers was measured by the following procedures. A 1 kÅ thermal oxide wafer was etched with the following process parameters: break through etch: 4 mTorr chamber pressure/600 Watts top coil power/65 Watts bottom electrode power/100 sccm HBr/10 sec etch time; main etch: 6 mTorr chamber pressure/350 Watts top coil power/20 Watts bottom electrode power/180 sccm HBr/65 sec etch time; and over etch: 80 mTorr chamber pressure/350 top coil power/75 Watts bottom electrode power/150 sccm HBr/150 sccm He/5 sccm $O_2$/90 sec etch time. The silicon wafers were etched using the following process parameters: 5 mT chamber pressure/250 Watts top coil power/150 Watts bottom electrode power/50 sccm $Cl_2$/120 sec etch time. Following etching, the thermal oxide wafers and the prime silicon wafers were analyzed for contamination using ICP-MS.

Thermal oxide wafers and bare silicon wafers were placed in the reactor chamber and etched using the above-described process parameters with and without components including a yttria-containing coating being present in the reactor chamber. During the testing with components not including a yttria-containing coating in the reactor chamber, a substantial amount of anodized aluminum of components in the reactor chamber was exposed to the plasma during testing. Following etching, the surface concentration of Al, Cr, Cu, Fe, Ni, Na and Y was measured in units of $10^{10}$ atoms/cm$^2$ for the wafers. A control oxide wafer, which had not been put into the reactor chamber, was also analyzed to confirm that the contamination levels measured for the etched wafers originated from the reactor chamber.

Figure 7:
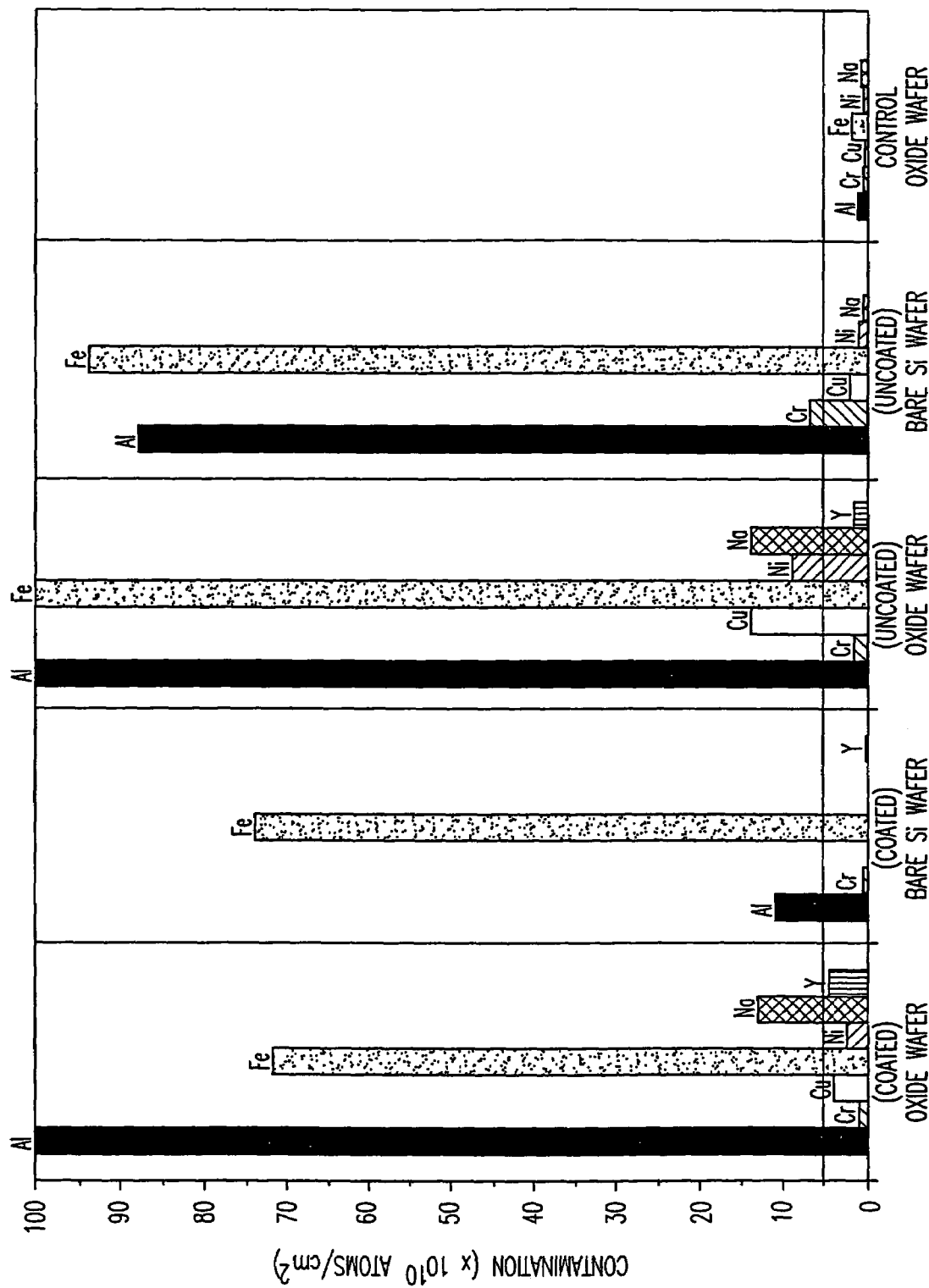
FIG. 7 shows the level of contamination of oxide and bare silicon wafers coated with a yttria-containing coating according to the invention and also left uncoated.

FIG. 7 shows the results for the contamination analysis of the wafers. "Coated" means yttria-coated components were present in the reactor chamber and "uncoated" means yttria-coated components were not present. Comparing the test results for the same wafer type, i.e., thermal oxide wafers and bare silicon wafers, the test results show that on an element-by-element basis, the results for reactor chamber including yttria-coated components was significantly lower than for the reactor chamber containing plasma exposed anodized aluminum surfaces on components. For example, the aluminum concentration measured for the "uncoated" bare silicon wafer was about $87 \times 10^{10}$ atoms/cm$^2$, while the aluminum concentration measured for the "coated" bare silicon wafer was about $12 \times 10^{10}$ atoms/cm$^2$. Also, the chromium concentration measured for the "uncoated" bare silicon wafer was about $7 \times 10^{10}$ atoms/cm$^2$, while the chromium concentration measured for the "coated" bare silicon wafer was about $10^9$ atoms/cm$^2$, which was the detection limit of the measuring equipment. For the thermal oxide wafers, the following results were obtained in units of $10^{10}$ atoms/cm$^2$: Al: "uncoated", 2000, "coated", 480; Cu: "uncoated", 15, "coated", 4; Fe: "uncoated", 72, "coated", 280; and Ni: "uncoated", 10, "coated", 2. Following testing, it was determined that an Fe contamination source had been present during testing, which increased the Fe levels in the wafers.

As also shown in FIG. 7, the yttria levels were insignificant for all of the wafers tested. For the bare silicon wafers, no yttria was detected above the detection limits of the measuring equipment. The results demonstrate the robust nature of the yttria-containing coatings in the plasma environment. Consequently, the yttria-containing coatings can achieve very low levels of on-wafer yttria contamination.

Accordingly, the above-described test results demonstrate that a significant reduction in the erosion rate of components exposed to plasma environments can be achieved by the yttria-containing coatings. As a result, the yttria-containing coatings can minimize contamination of semiconductor substrates contained in plasma etch reactors by yttria, as well as other elements from which the yttria-coated parts are formed.

The yttria-containing coatings can provide an extremely hard, wear resistant surface. Such coatings are desirably free of materials that react with processing chamber gases, and are chemically inert such that there is low or no particle contamination, minimal or no corrosion, minimal or no metal contamination and/or minimal or no volatile etch products. Thus, the yttria-containing coatings can decrease levels of metal and particulate contamination, lower costs by increasing the lifetime of consumables, decrease process drifts and reduce the levels of corrosion of chamber parts and substrates.

While the invention has been described in detail with reference to specific embodiments thereof, it will be apparent to those skilled in the art that various changes and modifications can be made, and equivalents employed, without departing from the scope of the appended claims.

What is claimed is:

1. A process of manufacturing a component of a semiconductor processing apparatus, comprising:
    anodizing a surface of an unroughened aluminum substrate;
    sealing the anodized aluminum surface; and
    applying a coating consisting essentially of yttria directly over the sealed anodized surface of the aluminum substrate by thermal spraying, the coating comprising an outermost surface of the component.

2. The process of claim 1, wherein the coating is formed to have an arithmetic mean surface roughness (Ra) effective to promote adhesion of polymer deposits.

3. The process of claim 1, wherein the coating has a tensile bond strength of about 7000 psi.

4. A process of etching a semiconductor wafer, comprising:
    placing a semiconductor wafer in a chamber of a plasma etch reactor, the plasma etch reactor comprising at least one component including an aluminum substrate having a sealed anodized surface and a thermal sprayed coating consisting essentially of yttria disposed directly over the sealed anodized surface, the coating forming an outermost surface of the component;
    introducing a process gas into the chamber;
    generating a plasma from the process gas; and
    etching the semiconductor wafer with the plasma,
    wherein the coating is exposed to the plasma during the etching.

5. The process of claim 4, wherein the plasma is generated by inductively coupling radio frequency energy into the chamber.

6. The process of claim 4, wherein the semiconductor wafer comprises at least one silicon-containing material selected from the group consisting of single-crystal silicon, polycrystalline silicon, amorphous silicon, silicon nitride, silicon oxynitride, silicides, silicon dioxide, low-k materials and high-k materials.

7. The process of claim 4, wherein the semiconductor wafer comprises at least one metal-containing material selected from the group consisting of aluminum, aluminum alloys, tungsten, tungsten alloys, titanium, titanium alloys, tantalum, tantalum alloys, platinum, platinum alloys, ruthenium, ruthenium alloys, chrome, chrome alloys, iron, iron alloys, nickel, nickel alloys, cobalt, cobalt alloys, molybdenum, molybdenum alloys, silicides of titanium, tungsten, chrome, cobalt and/or molybdenum, ferroelectric materials and GMR materials.

8. The process of claim 4, wherein the coating is formed to have an arithmetic mean surface roughness (Ra) that promotes adhesion of polymer deposits on the coating during the etching.

9. The process of claim 4, wherein the coating has a tensile bond strength of about 7000 psi.

10. A process of reducing contamination of a semiconductor wafer by erosion of a component in a chamber of a plasma etch reactor during etching of the semiconductor wafer in the plasma etch reactor, comprising:
    placing a semiconductor wafer in a chamber of a plasma etch reactor, the plasma etch reactor comprising at least one component including an aluminum substrate having a sealed anodized surface and a thermal sprayed coating consisting essentially of yttria disposed directly over the sealed anodized surface, the coating forming an outermost surface of the component;
    introducing a process gas into the chamber, the process gas being erosive with respect to the aluminum substrate material;
    generating a plasma from the process gas; and
    etching the semiconductor wafer with the plasma while exposing the coating to the plasma,
    wherein the coating minimizes contamination of the semiconductor wafer by the substrate material and yttria during the etching.

11. The process of claim 10, wherein the level of contamination of the semiconductor wafer by yttria is less than $10^{10}$ atoms/cm$^2$.

12. The process of claim 10, wherein the semiconductor wafer comprises at least one silicon-containing material and the process gas comprises fluorine.

13. The process of claim 12, wherein the silicon-containing material is selected from the group consisting of single-crystal silicon, polycrystalline silicon, amorphous silicon, silicon nitride, silicon oxynitride, silicides, silicon dioxide, low-k materials and high-k materials.

14. The process of claim 10, wherein the semiconductor wafer comprises at least one metal-containing material and the process gas comprises $BCl_3$.

15. The process of claim 14, wherein the metal-containing material is selected from the group consisting of aluminum, aluminum alloys, tungsten, tungsten alloys, titanium, titanium alloys, tantalum, tantalum alloys, platinum, platinum alloys, ruthenium, ruthenium alloys, chrome, chrome alloys, iron, iron alloys, nickel, nickel alloys, cobalt, cobalt alloys, molybdenum, molybdenum alloys, silicides of titanium, tungsten, chrome, cobalt and/or molybdenum, ferroelectric materials and GMR materials.

16. The process of claim 10, wherein the semiconductor wafer comprises silicon and the process gas comprises bromine.

17. The process of claim 10, wherein the process gas comprises $BCl_3$ and the coating is not eroded by the plasma during etching.

18. The process of claim 10, wherein the coating has a tensile has a tensile bond strength of about 7000 psi.

\* \* \* \* \*